United States Patent [19]

Sasaki

[11] 4,268,862
[45] May 19, 1981

[54] SYNCHRONIZING SIGNAL DETECTOR PARTICULARLY FOR USE IN TELEVISION AFT

[75] Inventor: Tadao Sasaki, Yokohama, Japan

[73] Assignee: Sony Corporation, Tokyo, Japan

[21] Appl. No.: 72,414

[22] Filed: Sep. 4, 1979

[30] Foreign Application Priority Data

Sep. 5, 1978 [JP] Japan .......................... 53-121192[U]

[51] Int. Cl.³ ............................................. H04N 5/08
[52] U.S. Cl. .................................. 358/153; 358/195.1
[58] Field of Search .................... 358/153, 158, 191.1, 358/193.1, 195.1; 455/182, 192, 184; 331/20

[56] References Cited

U.S. PATENT DOCUMENTS

| 3,949,158 | 4/1976 | Rzeszewski | 455/192 |
|---|---|---|---|
| 4,025,953 | 5/1977 | Sideris | 358/191.1 |
| 4,031,549 | 6/1977 | Rast | 358/195.1 |
| 4,041,535 | 8/1977 | Rzeszewski | 358/193.1 |
| 4,134,082 | 1/1979 | Fernsler | 331/20 |

Primary Examiner—Jin F. Ng
Assistant Examiner—Michael A. Masinick
Attorney, Agent, or Firm—Lewis H. Eslinger; Alvin Sinderbrand

[57] ABSTRACT

A synchronizing signal detector for detecting a received television synchronizing signal includes a synchronizing signal separator for separating the synchronizing signal from a received composite television signal. A phase-locked loop is provided, including an adjustable oscillator and a phase comparator for comparing the difference between the output of the synchronizing signal separator and the output of the local oscillator to produce an error signal. A sensor senses this error signal to indicate that the output of the synchronizing signal separator is, in fact, the synchronizing signal, when the error signal is of a predetermined value. In an AFT circuit, the error signal is used to control the tuning condition of the tuning section included in the television receiver. In one embodiment, the tuning section is an electronic tuner whose tuning condition is determined by a digital count. This count is changed until the error signal is sensed as being of the predetermined value, whereupon the digital count is inhibited from changing further.

9 Claims, 4 Drawing Figures

SYNCHRONIZING SIGNAL DETECTOR PARTICULARLY FOR USE IN TELEVISION AFT

BACKGROUND OF THE INVENTION

This invention relates to a synchronizing signal detector for detecting a received television synchronizing signal and, more particularly, to such a synchronizing signal detector which avoids false detection and, moreover, is readily adapted for use in an AFT circuit.

In a television receiver, and particularly, a color television receiver, it is desirable that the tuning section be tuned as closely as possible to the picture frequency of a broadcasted television channel. It is well known to provide automatic fine tuning (AFT) circuitry for effecting an automatic fine tuning operation in order to bring the tuning condition of the television receiver as closely as possible to the picture frequency of a broadcasted television channel. A conventional AFT circuit relies upon the intermediate frequency (IF) signal and, particularly, the level of the IF carrier, as an indication of whether the tuning section exhibits its desired tuning condition.

A typical composite color television signal includes a so-called picture carrier of frequency $f_p$, a sound carrier of frequency $f_s$ and a chrominance carrier of frequency $f_c$. For a given television channel, the picture carrier and sound carrier frequencies are separated by 4.5 MHz, with the sound carrier frequency being the higher frequency. If the IF signal is used as an AFT control signal, it is possible that a received sound carrier $f_s$ may, erroneously, be interpreted as a picture carrier $f_p$, with the result that the tuning section is tuned, erroneously, to the sound carrier and not to the picture carrier. It is a general problem that, when the IF signal is used as an AFT control signal, the automatic fine tuning operation may be controlled in response to the received picture carrier $f_p$, the received sound carrier $f_s$ or the received chrominance carrier $f_c$. Consequently, an erroneous automatic fine tuning operation may be carried out, and the tuning section of the television receiver may be tuned to an improper frequency such that the program information which is broadcasted over a television channel is not received properly.

To avoid this problem based upon using the IF signal as an AFT control signal, it has been proposed to rely upon the horizontal synchronizing signal included in the received composite television signal to control the AFT operation. The basis for this proposal is that if the tuning section of the television receiver is tuned properly to a picture carrier $f_p$, then the horizontal synchronizing signal will be detected easily, and this detected horizontal synchronizing signal will be of at least a predetermined level. If the television receiver is tuned improperly, the horizontal synchronizing signal will not be received and, consequently, separated or detected.

An implementation of the foregoing proposal to control an AFT operation with the separated horizontal synchronizing signal includes a synchronizing signal separator, a low pass filter and a peak detector. The horizontal synchronizing signal is separated from the received composite television signal, filtered and peak-detected. If the resultant DC level produced by the peak detector is less than a predetermined level, it is assumed that the tuning section is not tuned properly to a picture carrier $f_p$. The peak-detected DC signal then is used to adjust the tuning condition until the peak-detected DC signal exceeds a predetermined threshold. At that time, it is assumed that the tuning section is tuned properly to a picture carrier $f_p$.

However, in the foregoing implementation, it is possible that the output of the synchronizing signal separator is not a horizontal synchronizing signal but, rather, is a sound signal having an amplitude component that is interpreted by the synchronizing signal separator as being the synchronizing signal, this sound signal being transmitted by the sound carrier $f'_s$ of an adjacent television channel. With this misinterpretation, the tuning section of the television receiver may be tuned erroneously to the adjacent-channel sound carrier $f'_s$. Furthermore, because of cross modulation distortion attributed to high amplitudes of the picture carrier $f_p$ and the sound carrier $f_s$ in a given television channel, a false, or spurious, carrier $F_{IM}$ may be detected. This false carrier $f_{IM}$ may result in the erroneous detection of a false synchronizing signal, which has the effect of controlling the AFT operation such that the tuning section is tuned to this false carrier $f_{IM}$.

OBJECTS OF THE INVENTION

Therefore, it is an object of the present invention to provide an improved synchronizing signal detector which overcomes the aforementioned problems.

Another object of this invention is to provide an improved automatic fine tuning (AFT) circuit which avoids those problems noted hereinabove attending prior art AFT circuits.

A further object of this invention is to provide an improved synchronizing signal detector, which is readily adapted for use with an AFT circuit, that is not readily susceptible to detecting a false synchronizing signal.

An additional object of this invention is to provide an improved AFT circuit, which includes a synchronizing signal detector, which avoids locking the tuning section of a television receiver to an improper carrier, such as to the sound carrier of an adjacent television channel or to a false, or illusory carrier which may be the result of cross modulation distortion.

A still further object of this invention is to provide an improved synchronizing signal detector, which is readily adapted for use in a television AFT circuit, which uses a phase-locked loop for detecting the presence of a synchronizing signal.

Various other objects, advantages and features of the present invention will become readily apparent from the ensuing detailed description, and the novel features will be particularly pointed out in the appended claims.

SUMMARY OF THE INVENTION

In accordance with this invention, a synchronizing signal detector is provided with a synchronizing signal separator for separating a television synchronizing signal from a received composite television signal, and a phase-locked loop for sensing whether the output of the synchronizing signal separator is, in fact, a television synchronizing signal or an erroneous signal. The phase-locked loop includes an adjustable oscillator and a phase comparator for comparing the output of the synchronizing signal separator to the output of the adjustable oscillator and for producing an error signal as a function of the difference therebetween. The error signal is sensed to indicate the presence of the synchronizing signal when such error signal is at least a predetermined value. In using this synchronizing signal detector with an AFT circuit, a tuning-adjustment operation is carried out until the sensed error signal is of the predetermined value. At that time, the AFT circuit is locked to the frequency then received thereby.

BRIEF DESCRIPTION OF THE DRAWINGS

The following detailed description, given by way of example, will best be understood in conjunction with the accompanying drawings in which.

DETAILED DESCRIPTION OF A PREFERRED EMBODIMENT

Figure 1:
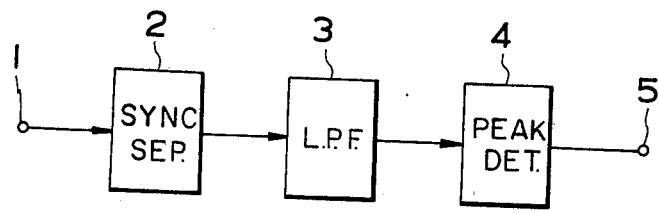
FIG. 1 is a block diagram of a synchronizing signal detector which has been proposed heretofore.

The advantages attained by the present invention will best be appreciated by first understanding the disadvantages and defects of a typical, previous proposal, which are overcome by this invention. Referring to FIG. 1, a previously proposed synchronizing signal detector is comprised of a synchronizing signal separator 2, a low pass filter 3, and a peak detector 4, all connected in cascade. This circuit, referred to as a synchronizing signal detector, is connected via its input terminal 1 to a conventional demodulator (not shown) which, as is typical, is supplied with the IF signal produced by the IF section in the television receiver. Synchronizing signal separator 2 is of conventional construction and is adapted to separate the horizontal synchronizing signal of 15.75 KHz from the composite television signal which is supplied to input terminal by the demodulator. The composite television signal may be a monochrome (i.e., black-and-white) television signal or a color television signal which includes chrominance and luminance components. In either case, the synchronizing signal separator separates the horizontal synchronizing signal from the demodulated composite television signal. This separated synchronizing signal is filtered by low pass filter 3; and the filtered signal is peak-detected by peak detector 4. As a result of this peak detection, the output of peak detector 4 supplies a DC level to output terminal 5.

To determine, or discriminate, whether a synchronizing signal has been separated by synchronizing signal separator 2, the DC level supplied to output terminal 5 by peak detector 4 is sensed. More particularly, this DC level is compared to a threshold level. If the DC level exceeds this threshold level, it is assumed that the output of synchronizing signal separator 2 is, in fact, the 15.75 KHz horizontal synchronizing signal. However, if the DC level produced by peak detector 4 does not exceed this threshold level, it is assumed that the output of the synchronizing signal separator is not the horizontal synchronizing signal. When this synchronizing signal detector is used with an AFT circuit, the DC level produced by peak detector 4 is used to control the AFT operation. In such an operation, it is assumed that the amplitude of the separated horizontal synchronizing signal is of a sufficient level only when the tuning section of the television receiver (not shown) is tuned to a picture carrier $f_p$. Thus, the DC level supplied to output terminal 5 by peak detector 4 is used as an indication of whether the tuning section of the television receiver is tuned to the picture carrier $f_p$ or whether this tuning section has not yet reached its desired tuning condition. If the tuning section is not tuned properly to the picture carrier $f_p$, the level of the separated horizontal synchronizing signal derived at the output of synchronizing signal separator 2 is too low, resulting in the peak-detected output being less than the threshold level. The tuning condition of the television receiver tuning section then is adjusted until the peak-detected output level exceeds the threshold level.

Figure 2:
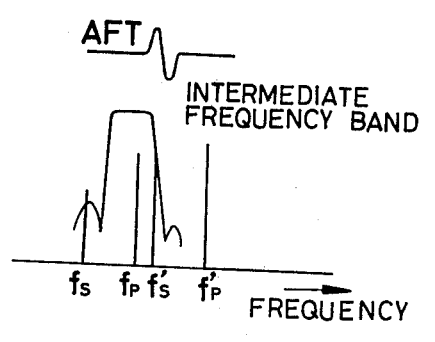
FIG. 2 is a representation of the frequency spectrum which may result in erroneous operation of the synchronizing signal detector of FIG. 1.

However, the proposal shown in FIG. 1 is susceptible to indicating a false synchronizing signal and, therefore, may cause an erroneous AFT operation. For example, and as shown in FIG. 2, if the tuning condition of the tuning section is such that the IF output from the television IF section includes both the IF picture carrier $f_p$ of the desired television channel and the IF sound carrier $f'_s$ of the adjacent television channel, the IF frequency spectrum may appear as shown. It is, of course, recognized that, although the broadcasted picture carrier frequency for a given television channel is less than the sound carrier frequency for that channel, the IF picture carrier frequency is greater than the IF sound carrier frequency. If the adjacent-channel IF sound carrier $f'_s$ includes amplitude-modulated components whose levels exceed the clipping level of the synchronizing signal separator, such components may be detected, erroneously, by the proposal shown in FIG. 1 as a horizontal synchronizing signal. Consequently, even though the tuning section of the television receiver may be tuned to the adjacent-channel sound carrier $f'_s$ and not to the proper picture carrier $f_p$, the peak-detected level produced by peak detector 4 may exceed the threshold level. Hence, the AFT circuit will be driven to tune the tuning section to this adjacent-channel sound carrier $f'_s$.

Figure 3:
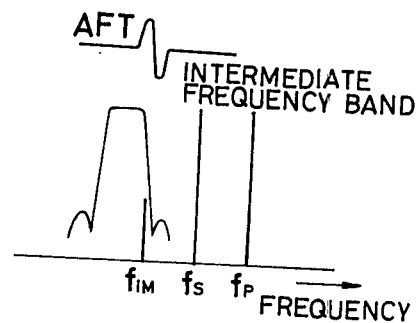
FIG. 3 is another representation of the frequency spectrum which may result in erroneous operation of the synchronizing signal detector of FIG. 1.

The proposal shown in FIG. 1, if used in an AFT circuit, may control the AFT operation so as to tune the tuning section of the television receiver to a false, or illusory carrier, $f_{IM}$, as shown in FIG. 3. If the IF picture carrier $f_p$ and the IF sound carrier $f_s$ of the desired television channel are excessively high, the false or illusory carrier $f_{IM}$ may be produced by cross modulation distortion of these picture and sound carriers. This false carrier $f_{IM}$ may contain modulated components that exceed the clipping level of the synchronizing signal separator. Consequently, such components will be detected by the proposal shown in FIG. 1 as an erroneous horizontal synchronizing signal. This erroneous horizontal synchronizing signal will have the effect of controlling the AFT operation such that the tuning section of the television receiver is tuned to the false carrier $f_{IM}$.

The present invention provides an improved synchronizing signal detector which overcomes the aforenoted problems attending the proposal shown in FIG. 1. It is an advantage of this invention that false synchronizing signals are not erroneously detected in response to an adjacent-channel sound carrier $f'_s$ or in response to a false or illusory carrier $f_{IM}$. Because of this advantage, the present invention may be readily incorporated into an AFT circuit which will not be locked erroneously to an improper carrier.

Figure 4:
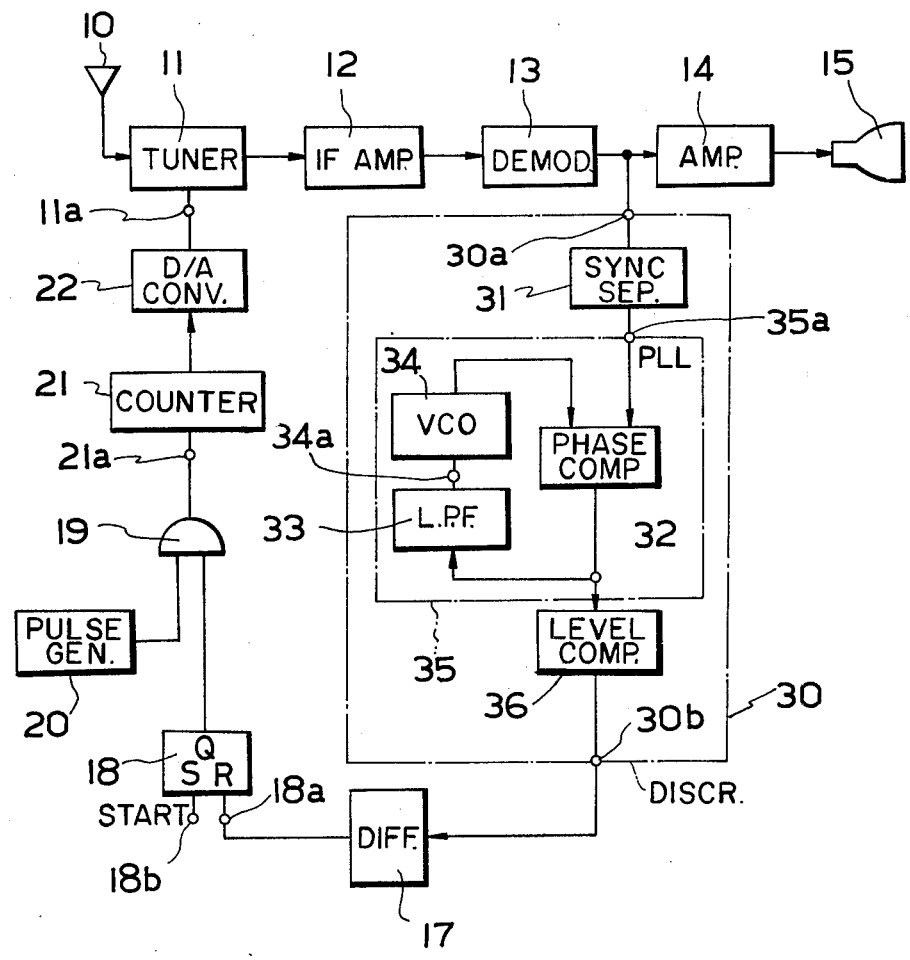
FIG. 4 is a block diagram of the synchronizing signal detector in accordance with the present invention, and additionally shows the use of this synchronizing signal detector in an AFT circuit.

Turning now to FIG. 4, a preferred embodiment of the synchronizing signal detector is shown in block 30;

and this embodiment is used in an AFT circuit for a television receiver. The television receiver is illustrated generally as comprising a tuning section 11, an IF section 12, a demodulator 13, a video amplifier 14 and a cathode ray rube 15. Tuning section 11 is coupled to an antenna 10, or other video signal supplying means, to receive broadcasted television channels. The tuning section also includes a tuning control input 11a which is connected to receive a control signal for selecting the particular television channel to which tuning section 11 is tuned. It may be appreciated that the tuning section includes an electronic tuner having a variable impedance element, such as a variable capacitance diode, whereby the tuning condition thereof is determined by an electronic control voltage supplied to control input 11a.

The output of tuning section 11 is an IF signal including an IF picture carrier $f_p$ which is modulated with video information, including the horizontal synchronizing signals, and an IF sound carrier $f_s$ which is frequency-modulated with sound information. These IF signals are supplied to demodulator 13 which functions to demodulate the video information, including the horizontal synchronizing signal, from the IF output. The demodulated video signals are supplied to video amplifier 14 and also to an input 30a of synchronizing signal separator 31, the latter being included in synchronizing signal detector 30. Video amplifier 14 amplifies the video information signals, such as the luminance signals, to drive cathode ray tube 15 in conventional manner. Although not shown herein, demodulator 13 also may include a chrominance demodulating section for demodulating color signals from the IF composite video signal. The demodulator and video amplifier circuitry is conventional and, in the interest of brevity, further description thereof is not provided.

Synchronizing signal separator 31 may be similar to aforementioned synchronizing signal separator 32 and, for example, may include a synchronizing clipper circuit. Thus, synchronizing signal separator 31 may separate both actual horizontal signals and false synchronizing signals. The output of the synchronizing signal separator is connected to an input 35a of a phase-locked loop 35. This phase-locked loop includes an adjustable oscillator, such as a voltage-controlled oscillator (VCO) 34, a phase comparator 32 and a low pass filter 33. VCO 34 is adapted to produce an oscillating signal whose frequency is controlled by a control voltage supplied to a control input 34a thereof. This oscillating signal is supplied to one input of phase comparator 32, the other input of which is connected to input 35a to receive the output from synchronizing signal separator 31. The phase comparator is adapted to produce an error signal whose level is a function of the phase differential between the output of VCO 34 and the output of synchronizing signal separator 31. This error signal is filtered by low pass filter 33 and fed back as the control signal to VCO 34. Thus, when the oscillating signal produced by VCO 34 is synchronized in frequency and phase to the horizontal synchronizing signal which is separated by synchronizing signal separator 31, the error signal produced by phase comparator 32 is of a predetermined value.

VCO 34 has a center frequency of 15.75 KHz, that is, the horizontal synchronizing signal frequency. Furthermore, the VCO exhibits a predetermined lock-in, or capture range which means that, if the oscillating signal generated by the VCO differs in frequency from the output of synchronizing signal separator 31 by more than a predetermined amount, this lock-in range is exceeded and the VCO cannot be synchronized with the output of the synchronizing separator. The condition that the lock-in range of VCO 34 is exceeded is indicated by the level of the error signal produced by phase comparator 32. For example, if the error signal produced by the phase comparator is at its null level when phase-locked loop 35 is locked to the horizontal synchronizing signal, then this error signal will be outside a predetermined range about its null value when the lock-in range of VCO 34 is exceeded.

A level comparator 36 is connected to phase comparator 32 to receive the error signal and to compare this error signal to a predetermined value that corresponds to the aforementioned threshold range or, alternatively, that is well within this threshold range. If the error signal exceeds this predetermined value, level comparator 36 supplies a signal to output 30b that, for example, corresponds to a binary "0". However, if the error signal is reduced to this predetermined value, representing that the output of synchronizing signal separator 31 is within the lock-in range of VCO 34 and, moreover, that phase-locked loop 35 is about to be locked to the output of the synchronizing signal separator, then level comparator 36 supplies a signal to output 30b corresponding to a binary "1". Thus, if the output of synchronizing signal separator 31 is within the lock-in range of VCO 34, and if phase-locked loop 35 is about to be locked to this output, a positive transition is provided at output 30b of synchronizing signal detector 30. This transition is used to control an AFT operation.

One embodiment of an AFT circuit which can be used with synchronizing signal detector 30 is illustrated as comprising a flip-flop circuit 18, a pulse generator 20, a pulse counter 21 and a digital-to-analog (D/A) converter 22. Flip-flop circuit 18 may comprise a conventional R-S flip-flop circuit whose set input S is connected to an input 18b adapted to receive a START signal when a tuning operation is initiated. The rest input R of flip-flop circuit 18 is connected to an input 18a to receive a reset pulse generated by a differentiator 17 which, in turn, is connected to output 30b of synchronizing signal detector 30. Differentiator 17 may be of conventional construction to supply a reset pulse to the reset input R of flip-flop circuit 18 in response to a positive transition supplied thereto by the synchronizing signal detector.

The Q output of flip-flop circuit 18 is adapted to provide a binary "1" enabling signal when the flip-flop circuit is in its set state and to provide a binary "0" inhibit signal when the flip-flop circuit is in its reset state. An AND gate 19 includes one input connected to the Q output of flip-flop circuit 18 and another input connected to receive pulses which are supplied thereto by pulse generator 20. When AND gate 19 is enabled by the binary "1" enable signal produced by flip-flop circuit 18, the pulses generated by pulse generator 20 are gated to a pulse input 21a of pulse counter 21. These pulses are incremented (or decremented) by the pulse counter to produce a digital count signal. This digital count signal is supplied as a control signal to D/A converter 22, the latter functioning to convert this digital count signal to a corresponding analog control signal. This control signal is supplied as the tuning control signal to control input 11a of tuning section 11. Thus, it is seen that the tuning condition of tuning section 11 is determined by the digital count signal of pulse counter 21.

Let it be assumed that a tuning operation is to be initiated. Accordingly, the START signal is supplied to the set input S of flip-flop circuit 18, thereby enabling AND gate 19. Hence, pulse signals are gated from pulse generator 20 via AND gate 19 to pulse counter 21. As the count of this pulse counter is changed, the corresponding analog signal related to this pulse count likewise is changed, resulting in an adjustment of the tuning condition of tuning section 11. As the tuning condition of tuning section 11 approaches a correct television channel, the IF output of IF stage 12 will contain the IF picture carrier $f_p$ and the IF sound carrier $f_s$ associated with that channel. The video signal modulated onto the IF picture carrier $f_p$ is demodulated by demodulator 13, and the horizontal synchronizing signals are separated by synchronizing signal separator 31. These separated synchronizing signals are supplied to phase comparator 32 which compares the phase of the oscillating signal generated by VCO 34 thereto. If tuning section 11 is tuned correctly, the output of synchronizing signal separator 31 will be constituted primarily by the separated horizontal synchronizing signals which, of course, are within the lock-in range of VCO 34. Consequently, phase-locked loop 35 will be locked to these separated synchronizing signals; and the error signal supplied by phase comparator 32 of the phase-locked loop to level comparator 36 will be equal to the predetermined value. Hence, level comparator 36 supplies a transition (for example, a positive transition) to differentiator 17 which, in turn, supplies a reset pulse to the reset input R of flip-flop circuit 18. This reset pulse resets the flip-flop circuit so as to supply a binary "0" inhibit signal to AND gate 19. This inhibits the AND gate which blocks further pulses from being supplied to pulse counter 21. Consequently, the last-attained count of the pulse counter is retained therein, and tuning section 11 remains tuned to the particular broadcast channel from which the horizontal synchronizing signals had been derived.

If the tuning condition of tuning section 11 is as represented in FIG. 2, it is appreciated that the output of synchronizing signal separator 31 is constituted by signals which may be characterized as false synchronizing signals. These false synchronizing signals generally are not of the proper 15.75 KHz synchronizing signal frequency. In fact, such false synchronizing signals are outside the lock-in range of VCO 34. Hence, phase-locked loop 35 is unable to lock onto these false synchronizing signals. This means that the error signal produced by phase comparator 32 is not equal to its predetermined value and, moreover, is outside the range corresponding to the lock-in range of the VCO. Level comparator 36 senses that the error signal is substantially in excess of its predetermined value so as to supply a binary "0" to differentiator 17. In the absence of a transition supplied to the differentiator, flip-flop circuit 18 remains in its set state so that additional pulses are supplied to and counted by pulse counter 21. This, in turn, continues to change the tuning condition of tuning section 11. Of course, when the tuning section ultimately is tuned to a broadcasted television channel, the output of synchronizing signal separator 31 is constituted primarily by an actual synchronizing signal to which the phase-locked loop 35 may lock. At that time, the error signal produced by phase comparator 32 is equal to, or less than, its predetermined value, resulting in a transition at output 30b of synchronizing signal detector 30. It is recalled that this transition resets flip-flop circuit 18 to inhibit further pulses from being supplied to pulse counter 31.

Similar to the foregoing operation in the event that tuning section 11 exhibits the tuning condition shown in FIG. 2, if the tuning section exhibits the tuning condition shown in FIG. 3, the output of synchronizing signal separator 31 is derived from the false carrier $f_{IM}$, which output is not constituted by true horizontal synchronizing signals. Thus, since the output of the synchronizing signal separator is outside the lock-in range of VCO 34, phase-locked loop 35 is unable to be locked to this output. As before, level comparator 36 senses that the phase-locked loop cannot be locked to the output of the synchronizing signal separator and, therefore, flip-flop circuit 18 remains in its set state so as to enable additional pulses to be supplied to and counted by pulse counter 21.

When the tuning condition of tuning section 11 is as represented in FIG. 2, the output of IF section 12 includes a difference frequency signal which lies between the normal picture carrier $f_p$ and the adjacent-channel sound carrier $f'_s$, separated from each carrier by approximately 1.5 MHz. This 1.5 MHz frequency difference appears as a beat signal which is supplied to synchronizing signal separator 31 in addition to the expected horizontal synchronizing signal of 15.75 KHz. Consequently, since VCO 34 is unable to lock onto the 1.5 MHz beat signal, phase comparator 32 produces an error signal which deviates substantially from its predetermined value. This condition of the error signal is sensed by level comparator 36 which provides an indication that phase-locked loop 35 is not locked to the output of synchronizing signal separator 31, which indication represents the absence of the synchronizing signal.

Thus, it is seen that synchronizing signal detector 30 detects the presence or absence of the horizontal synchronizing signal at the output of synchronizing signal separator 31. If the output of the synchronizing signal separator is constituted by the horizontal synchronizing signal, that is, if tuning section 11 is tuned to the proper frequency, VCO 34 is enabled to lock onto this synchronizing signal, and the error signal produced by phase comparator 32 is equal to its predetermined value. This value is sensed by level comparator 36 which, when phase-locked loop 35 is locked to the synchronizing signal, produces a transition at output 30b. As described above, flip-flop circuit 18 is reset in response to this transition, and the state of this flip-flop circuit can be used as an indication of the presence or absence of the synchronizing signal. If the output of synchronizing signal separator 31 is other than the horizontal synchronizing signal, for example, if tuning section 11 exhibits the tuning conditions represented by FIG. 2 or 3, the signal which is produced by the synchronizing signal separator has a frequency which falls outside the lock-in range of VCO 34. Consequently, phase-locked loop 35 cannot lock onto this false synchronizing signal, and the error signal produced by phase comparator 32 deviates substantially (e.g. it is far in excess of) its predetermined value. Since the phase-locked loop cannot lock onto the output of the synchronizing signal separator, level comparator 36 does not produce a transition at output 30b. Consequently, flip-flop circuit 18 remains in its set state so as to enable further adjustment in the tuning condition of tuning section 11, as discussed above. It is appreciated that synchronizing signal detector 30 is readily enabled to discriminate between actual and false synchronizing signals. Thus, the synchronizing signal detector serves to sense when tuning section 11 is tuned to a correct television channel.

If desired, phase-locked loop 35, as well as synchronizing signal detector 30, may be constructed as an integrated circuit.

While the present invention has been particularly shown and described with reference to a preferred embodiment, it should be readily appreciated that various changes and modifications in form and details may be made without departing from the spirit and scope of the invention. For example, the transition provided at output 30b by level comparator 36 when the error signal produced by phase comparator 32 crosses its predetermined value representing that phase-locked loop 35 is locked to the output of synchronizing signal separator 31 may be a negative transition. This negative transition results in a negative-going reset pulse to reset flip-flop circuit 18 and, thus, inhibits further change in the tuning condition of tuning section 11. Level comparator 36 may produce an output transition only when the error signal from phase comparator 32 crosses a predetermined threshold. For example, if the error signal is reduced to a null level when phase-locked loop 35 is phase-locked to the synchronizing signal produced by synchronizing signal separator 31, level comparator 36 may produce an output transition when this error signal is within a predetermined amount from its null level. In one embodiment, level comparator 36 produces an output transition when the level of the error signal from phase comparator 32 is reduced to a level that corresponds to the lock-in range of VCO 34. In another embodiment, level comparator 36 produces an output transition when the error signal is reduced to a level which is close to its null, or predetermined, level representing that VCO 34 is locked to the synchronizing signal produced by synchronizing signal separator 31. It is intended that these as well as various other such changes and modifications fall within the scope of the appended claims.

What is claimed is:

1. A synchronizing signal detector for detecting a received television synchronizing signal, comprising synchronizing signal separating means supplied with a composite television signal for separating the television synchronizing signal therefrom and operable to pass both an actual synchronizing signal included within said composite television signal and a false synchronizing signal; phase-locked loop means, including an adjustable oscillator to produce an oscillating signal and phase comparison means for adjusting the frequency of said adjustable oscillator to be in synchronism with the output of said synchronizing signal separating means, said phase comparison means producing an error signal as a function of the difference between said oscillating signal and said output of said synchronizing signal separating means, and means for supplying said error signal as a frequency control signal for said adjustable oscillator; and sensing means for sensing said error signal to indicate the presence of said synchronizing signal when said error signal is of predetermined value.

2. The invention of claim 1 wherein said sensing means comprises level comparator means for comparing said error signal to a threshold level.

3. The invention of claim 2 wherein said phase-locked loop means has a predetermined lock-in range, and said threshold level represents said lock-in range, such that if said error signal exceeds said threshold level, the output of said synchronizing signal separating means is outside the lock-in range of said phase-locked loop means, thereby representing the absence of said synchronizing signal.

4. Automatic tuning apparatus for tuning a television receiver to receive television signals transmitted on predetermined television channels, comprising controllable tuning means responsive to a tuning control signal to be tuned to a channel determined by said tuning control signal; counting means for counting pulses supplied thereto to produce a count representing a channel to which said controllable tuning means is tuned; means for converting said count to a corresponding tuning control signal; means for supplying pulses to said counting means to change the count thereof; means coupled to the output of said tuning means for providing a composite television signal, including a television picture component derived from the television signals which are transmitted on the channel to which said tuning means is tuned and also having an error component includable therein; synchronizing signal separating means supplied with said composite television signal for separating a television synchronizing signal from said television picture component and operable to pass both an actual synchronizing signal included within said television picture component and a false synchronizing signal; phase-locked loop means supplied with the output of said synchronizing signal separating means and operative to be locked to said television synchronizing signal; sensing means for sensing if said phase-locked loop means is in a locked condition; and inhibit means responsive to the sensed locked condition of said phase-locked loop means to inhibit said pulses from being supplied to said counting means.

5. The apparatus of claim 4 wherein said phase-locked loop means includes a controllable oscillator and phase comparator means for comparing the phase of the output of said controllable oscillator to the phase of the output of said synchronizing signal separating means to produce an error signal as a function of the difference therebetween; and said sensing means comprises level detecting means for detecting when said error signal is of predetermined value corresponding to a locked condition of said phase-locked loop means.

6. The apparatus of claim 5 wherein said level detecting means comprises threshold detecting means for comparing said error signal to a threshold level representing a locked condition and for producing an indicating signal when the level of said error signal traverses said threshold level in a predetermined direction.

7. The apparatus of claim 5 wherein said inhibit means comprises flip-flop means having a first state to enable pulses to be supplied to said counting means and a second state to inhibit said pulses from being supplied; and means coupled to said level detecting means for energizing said flip-flop means to said second state when said error signal is of said predetermined value.

8. The apparatus of claim 7 wherein said means for supplying pulses to said counting means comprises a source of pulses; and gate means conditioned by said first state of said flip-flop means to pass said pulses from said source to said counting means and de-conditioned by said second state of said flip-flop means to block said pulses.

9. The apparatus of claim 8 wherein said tuning means is a voltage-controllable tuning means, and further comprising digital-to-analog converting means for converting the count of said counting means to a corresponding control voltage and for applying said control voltage to said voltage-controlled tuning means to determine the channel to which said voltage-controlled tuning means is tuned.

* * * * *